US012565582B2

(12) United States Patent
Wu et al.

(10) Patent No.: US 12,565,582 B2

(45) Date of Patent: Mar. 3, 2026

(54) RESIN COMPOSITION AND METAL CLAD SUBSTRATE

(71) Applicant: ITEQ CORPORATION, Hsinchu County (TW)

(72) Inventors: Sheng-Yen Wu, Hsinchu County (TW); Shou-Neng To, Hsinchu County (TW); Ya-Ping Liu, Hsinchu County (TW); Chen-Hao Chang, Hsinchu County (TW); Pei-Chun Lai, Hsinchu County (TW)

(73) Assignee: ITEQ CORPORATION, Hsinchu County (TW)

( * ) Notice: Subject to any disclaimer, the term of this patent is extended or adjusted under 35 U.S.C. 154(b) by 386 days.

(21) Appl. No.: 18/314,100

(22) Filed: May 8, 2023

(65) Prior Publication Data

US 2024/0002653 A1 Jan. 4, 2024

(30) Foreign Application Priority Data

Jun. 29, 2022 (TW) ................................ 111124165

(51) Int. Cl.

*C08L 63/00* (2006.01)
*H05K 1/03* (2006.01)
*H05K 1/05* (2006.01)

(52) U.S. Cl.

CPC ............ *C08L 63/00* (2013.01); *H05K 1/0346* (2013.01); *H05K 1/056* (2013.01); *C08L 2205/025* (2013.01); *C08L 2205/035* (2013.01)

(58) Field of Classification Search

CPC ............... C08L 63/00; C08L 2205/025; C08L 2205/035; H05K 1/0346; H05K 1/056

See application file for complete search history.

(56) References Cited

U.S. PATENT DOCUMENTS

| | | | | |
|---|---|---|---|---|
| 2018/0362733 | A1* | 12/2018 | Yao | C08K 5/5397 |
| 2019/0153177 | A1* | 5/2019 | Nakazumi | C08K 3/38 |

FOREIGN PATENT DOCUMENTS

| | | | | |
|---|---|---|---|---|
| CN | 108291122 | A | | 7/2018 |
| CN | 114605767 | A | | 6/2022 |
| JP | 2002265537 | A | * | 9/2002 |
| JP | 201323688 | A | | 2/2013 |
| TW | 201811913 | A | | 4/2018 |

OTHER PUBLICATIONS

Machine Translation of Ueda et al. (JP 2002265537 A) (Year: 2002).*

* cited by examiner

*Primary Examiner* — Callie E Shosho
*Assistant Examiner* — Bethany M Miller
(74) *Attorney, Agent, or Firm* — Li & Cai Intellectual Property Office

(57) ABSTRACT

A resin composition and a metal clad substrate are provided. The resin composition includes: 5 phr to 15 phr of a maleimide resin, 5 phr to 30 phr of a benzoxazine resin, 40 phr to 70 phr of an epoxy resin, and 40 phr to 60 phr of fillers. An amount of fluorine atoms contained in the maleimide resin ranges from 10 wt % to 50 wt %.

10 Claims, 5 Drawing Sheets

RESIN COMPOSITION AND METAL CLAD SUBSTRATE

CROSS-REFERENCE TO RELATED PATENT APPLICATION

This application claims the benefit of priority to Taiwan Patent Application No. 111124165, filed on Jun. 29, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a resin composition and a metal clad substrate, and more particularly to a resin composition and a metal clad substrate that have a low coefficient of thermal expansion, a low water absorption rate, a low dielectric constant, and a low dielectric loss.

BACKGROUND OF THE DISCLOSURE

A benzoxazine resin is a thermosetting resin having a structure that is similar to a phenol formaldehyde resin, and has properties that are superior to those of the conventional phenol formaldehyde resin. For example, the benzoxazine resin has a low hygroscopic rate and excellent mechanical performances and dielectric properties. During a curing process, the benzoxazine resin does not release small molecules as a by-product, and its volume shrinkage rate after curing is low.

Accordingly, the benzoxazine resin has a wide application, and more particularly, can be applied to manufacturing of a metal clad substrate. Specifically, the benzoxazine resin can be mixed with other types of resins, and can be used for forming a cured product positioned between a metal substrate and a printed circuit board.

However, with the progression of technology, property requirements for the metal clad substrate have also increased in the relevant industry. Properties and specifications of the benzoxazine resin currently available on the market are gradually failing to meet product requirements.

Therefore, how to enhance the overall properties of the benzoxazine resin through an improvement in composition, so as to overcome the above-mentioned problems, has become one of the important issues to be solved in the related art.

SUMMARY OF THE DISCLOSURE

In response to the above-referenced technical inadequacies, the present disclosure provides a resin composition and a metal clad substrate.

In one aspect, the present disclosure provides a resin composition, which includes: 5 phr to 15 phr of a maleimide resin, 5 phr to 30 phr of a benzoxazine resin, 40 phr to 70 phr of an epoxy resin, and 40 phr to 60 phr of fillers. An amount of fluorine atoms contained in the maleimide resin ranges from 10 wt % to 50 wt %.

In certain embodiments, the maleimide resin includes a fluorine-containing maleimide compound. The fluorine-containing maleimide compound is represented by formula (I):

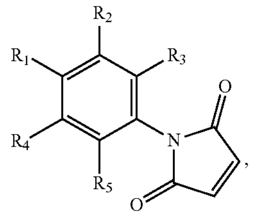

in which $R_1$ is selected from the group consisting of —F and —$CF_3$, and at least one of $R_2$, $R_3$, $R_4$, and $R_5$ is —F or —$CF_3$.

In certain embodiments, the fluorine-containing maleimide compound is formed by an imidization reaction between maleic anhydride and fluorine-containing aniline. The fluorine-containing aniline is represented by formula (II):

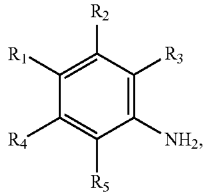

in which $R_1$ is selected from the group consisting of —F and —$CF_3$, and at least one of $R_2$, $R_3$, $R_4$, and $R_5$ is —F or —$CF_3$.

In certain embodiments, the fluorine-containing aniline is selected from the group consisting of:

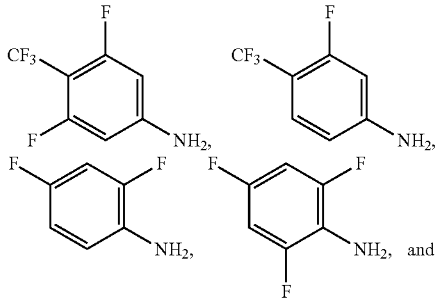

and

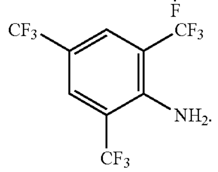

In certain embodiments, the epoxy resin includes a cresol novolac epoxy resin, a bisphenol A novolac epoxy resin, a bisphenol A epoxy resin, and a long-chain epoxy resin.

In certain embodiments, based on a total weight of the epoxy resin being 100 wt %, an amount of the cresol novolac epoxy resin ranges from 12 wt % to 20 wt %, an amount of the bisphenol A novolac epoxy resin ranges from 18 wt % to 25 wt %, an amount of the bisphenol A epoxy resin ranges from 20 wt % to 25 wt %, and an amount of the long-chain epoxy resin ranges from 35 wt % to 45 wt %.

In certain embodiments, the benzoxazine resin can include a bisphenol A benzoxazine resin and a diamine-type benzoxazine resin.

In certain embodiments, an amount of the bisphenol A benzoxazine resin is greater than an amount of the diamine-type benzoxazine resin.

In certain embodiments, an amount of the benzoxazine resin is 1.3 to 1.8 times an amount of the maleimide resin.

In another aspect, the present disclosure provides a metal clad substrate, which includes a metal substrate, a cured product, and a printed circuit board. The cured product is formed on the metal substrate, and the cured product is formed after curing of a resin composition. The resin composition includes: 5 phr to 15 phr of a maleimide resin, 5 phr to 30 phr of a benzoxazine resin, 40 phr to 70 phr of an epoxy resin, and 40 phr to 60 phr of fillers. An amount of fluorine atoms contained in the maleimide resin ranges from 10 wt % to 50 wt %. The printed circuit board is formed on the cured product.

In certain embodiments, the maleimide resin includes a fluorine-containing maleimide compound. The fluorine-containing maleimide compound is represented by formula (I):

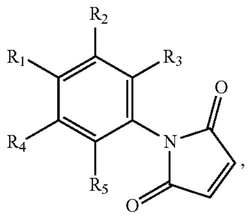

in which $R_1$ is selected from the group consisting of —F and —$CF_3$, and at least one of $R_2$, $R_3$, $R_4$, and $R_5$ is —F or —$CF_3$.

In certain embodiments, the fluorine-containing maleimide compound is reactively grafted with a molecular side chain of the benzoxazine resin.

Therefore, in the resin composition and the metal clad substrate provided by the present disclosure, by virtue of "the resin composition including: 5 phr to 15 phr of a maleimide resin, 5 phr to 30 phr of a benzoxazine resin, 40 phr to 70 phr of an epoxy resin, and 40 phr to 60 phr of fillers" and "an amount of fluorine atoms contained in the maleimide resin ranging from 10 wt % to 50 wt %," a coefficient of thermal expansion, a water absorption rate, a dielectric constant, and a dielectric loss of the metal clad substrate can be reduced.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
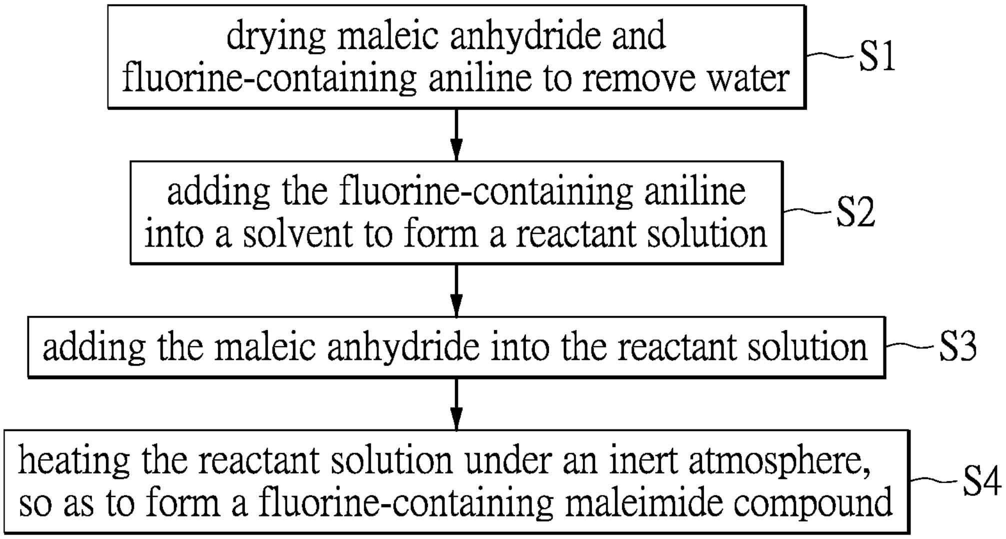
FIG. 1 is a flowchart illustrating steps of synthesizing a fluorine-containing maleimide compound according to the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

A cured product and a metal clad substrate of the present disclosure are manufactured by using a resin composition. Properties of the cured product that is formed by the resin composition include a low coefficient of thermal expansion, a low water absorption rate, a low dielectric constant, and a low dielectric loss, such that the cured product is suitable for manufacturing the metal clad substrate.

In the present disclosure, the resin composition includes: 5 phr to 15 phr of a maleimide resin; 5 phr to 30 phr of a benzoxazine resin; 40 phr to 70 phr of an epoxy resin; and 40 phr to 60 phr of fillers.

It should be noted that the added maleimide resin of the present disclosure includes a fluorine-containing functional group. The fluorine-containing functional group of the maleimide resin can reduce the coefficient of thermal expansion, the water absorption rate, the dielectric constant, and the dielectric loss of the resin composition, thereby enhancing the properties of the cured product and the metal clad substrate. Specifically, the maleimide resin contains 10 wt % to 50 wt % of fluorine atoms. In some embodiments, the maleimide resin contains 15 wt %, 20 wt %, 25 wt %, 30 wt %, 35 wt %, 40 wt %, or 45 wt % of the fluorine atoms.

In some embodiments, the maleimide resin includes a fluorine-containing maleimide compound. The structure of the fluorine-containing maleimide compound is represented by formula (I):

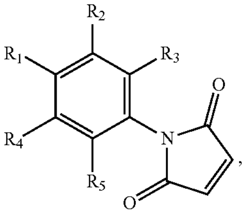

in which $R_1$ is selected from the group consisting of —F and —$CF_3$, and at least one of $R_2$, $R_3$, $R_4$, and $R_5$ is —F or —$CF_3$.

In some embodiments, the fluorine-containing maleimide compound is synthesized through a ring-closure polyimidization reaction between maleic anhydride and fluorine-containing aniline. In addition, the fluorine-containing functional group (the trifluoromethyl group or the fluorine atoms) of the fluorine-containing maleimide compound is contributed by the fluorine-containing aniline.

In some embodiments, the structure of the fluorine-containing aniline is represented by formula (II):

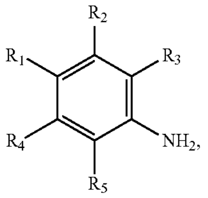

in which R1 is selected from the group consisting of —F and —$CF_3$, and at least one of $R_2$, $R_3$, $R_4$, and $R_5$ is —F or —$CF_3$.

In some embodiments, $R_2$ and $R_4$ have the same substituent. For example, $R_2$ and $R_4$ can be —F at the same time. In other embodiments, $R_3$ and $R_5$ have the same substituent. For example, $R_3$ and $R_5$ can be —F or —$CF_3$ at the same time.

In one exemplary embodiment, the fluorine-containing aniline is selected from the group consisting of:

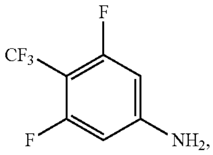

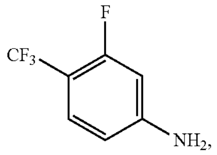

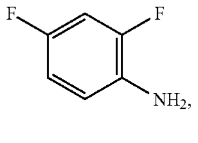

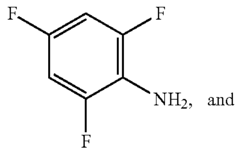

and

-continued

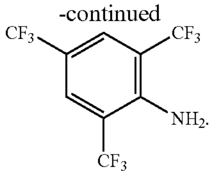

In one exemplary embodiment, the structure of the fluorine-containing aniline is symmetrical. In this way, a dielectric constant and a dielectric loss of the metal clad substrate can be effectively reduced. That is to say, the structure of the fluorine-containing aniline is preferably:

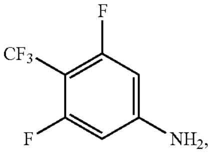

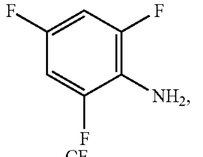

or

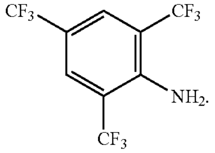

During a synthesis process of the fluorine-containing maleimide compound, since water can cause a reverse hydrolysis reaction of an intermediate (i.e., a polyimide acid), the fluorine-containing maleimide compound cannot be formed.

In order to exclude the effect of the water, the maleic anhydride and the fluorine-containing aniline are dried before the reaction takes place. In addition, during the reaction process, the maleic anhydride and the fluorine-containing aniline are maintained to react in an inert atmosphere, so as to prevent the water in a reactant or water vapor in the air from adversely affecting an imidization reaction.

As shown in FIG. 1, specific steps of synthesizing the fluorine-containing maleimide compound include: drying the maleic anhydride and the fluorine-containing aniline to achieve the effect of removing the water (step S1); adding, at a temperature from 50° C. to 70° C., the fluorine-containing aniline into a solvent to form a reactant solution (step S2); adding, at a temperature from 80° C. to 100° C., the maleic anhydride into the reactant solution (step S3); and heating the reactant solution to between 130° C. and 150° C. under the inert atmosphere, so as to form the fluorine-containing maleimide compound (step S4).

The following Synthesis Examples 1 to 5 specifically illustrate how the fluorine-containing maleimide compound is synthesized. In Synthesis Examples 1 to 5, different types of the fluorine-containing aniline are used to synthesize the fluorine-containing maleimide compounds that contain different amounts of the fluorine atoms.

Synthesis Example 1

A reactant solution is formed by adding 19.7 grams of 4-amino-2,6-difluorobenzotrifluoride and 150 grams of dimethylacetamide (DMAC) into a separable reaction flask. The reaction flask is heated to a temperature of 60° C., and the reactant solution is stirred until the 4-amino-2,6-difluorobenzotrifluoride is completely dissolved.

During the process of continuous stirring, 10 grams of the maleic anhydride is gradually added into the reactant solution within twenty minutes. Then, the temperature of the reaction flask is increased to 90° C., and 1 gram of 5-ethyl-2-methylpyridine is added as a catalyst. Finally, the temperature of the reaction flask is increased to 140° C., and the reaction lasts for one hour.

After the reaction is completed and the reaction flask is cooled to a room temperature, 400 grams of methanol is added for a product to precipitate. After the product is collected and washed three times with the methanol, the fluorine-containing maleimide compound (hereinafter referred to as MA-1) can be obtained. In Synthesis Example 1, the amount of the fluorine atoms in the fluorine-containing maleimide compound is 31.95 wt %.

Synthesis Example 2

A reactant solution is formed by adding 17.9 grams of 4-amino-2-fluorobenzotrifluoride and 150 grams of the dimethylacetamide (DMAC) into the separable reaction flask. The reaction flask is heated to the temperature of 60° C., and the reactant solution is stirred until the 4-amino-2-fluorobenzotrifluoride is completely dissolved.

During the process of continuous stirring, 10 grams of the maleic anhydride is gradually added into the reactant solution within twenty minutes. Then, the temperature of the reaction flask is increased to 90° C., and 1 gram of the 5-ethyl-2-methylpyridine is added as the catalyst. Finally, the temperature of the reaction flask is increased to 140° C., and the reaction lasts for one hour.

After the reaction is completed and the reaction flask is cooled to the room temperature, 400 grams of the methanol is added for a product to precipitate. After the product is collected and washed three times with the methanol, the fluorine-containing maleimide compound (hereinafter referred to as MA-2) can be obtained. In Synthesis Example 2, the amount of the fluorine atoms in the fluorine-containing maleimide compound is 27.21 wt %.

Synthesis Example 3

A reactant solution is formed by adding 12.9 grams of 2,4-difluoroaniline and 150 grams of the dimethylacetamide (DMAC) into the separable reaction flask. The reaction flask is heated to the temperature of 60° C., and the reactant solution is stirred until the 2,4-difluoroaniline is completely dissolved.

During the process of continuous stirring, 10 grams of the maleic anhydride is gradually added into the reactant solution within twenty minutes. Then, the temperature of the reaction flask is increased to 90° C., and 1 gram of the 5-ethyl-2-methylpyridine is added as the catalyst. Finally, the temperature of the reaction flask is increased to 140° C., and the reaction lasts for one hour.

After the reaction is completed and the reaction flask is cooled to the room temperature, 400 grams of the methanol is added for a product to precipitate. After the product is collected and washed three times with the methanol, the fluorine-containing maleimide compound (hereinafter referred to as MA-3) can be obtained. In Synthesis Example 3, the amount of the fluorine atoms in the fluorine-containing maleimide compound is 16.57 wt %.

Synthesis Example 4

A reactant solution is formed by adding 14.7 grams of 2,4,6-trifluoroaniline and 150 grams of the dimethylacetamide (DMAC) into the separable reaction flask. The reaction flask is heated to the temperature of 60° C., and the reactant solution is stirred until the 2,4,6-trifluoroaniline is completely dissolved.

During the process of continuous stirring, 10 grams of the maleic anhydride is gradually added into the reactant solution within twenty minutes. Then, the temperature of the reaction flask is increased to 90° C., and 1 gram of the 5-ethyl-2-methylpyridine is added as the catalyst. Finally, the temperature of the reaction flask is increased to 140° C., and the reaction lasts for one hour.

After the reaction is completed and the reaction flask is cooled to the room temperature, 400 grams of the methanol is added for a product to precipitate. After the product is collected and washed three times with the methanol, the fluorine-containing maleimide compound (hereinafter referred to as MA-4) can be obtained. In Synthesis Example 4, the amount of the fluorine atoms in the fluorine-containing maleimide compound is 25.1 wt %.

Synthesis Example 5

A reactant solution is formed by adding 29.7 grams of 2,4,6-tris(trifluoromethyl)aniline and 150 grams of the dimethylacetamide (DMAC) into the separable reaction flask. The reaction flask is heated to the temperature of 60° C., and the reactant solution is stirred until the 2,4,6-tris(trifluoromethyl)aniline is completely dissolved.

During the process of continuous stirring, 10 grams of the maleic anhydride is gradually added into the reactant solution within twenty minutes. Then, the temperature of the reaction flask is increased to 90° C., and 1 gram of the 5-ethyl-2-methylpyridine is added as the catalyst. Finally, the temperature of the reaction flask is increased to 140° C., and the reaction lasts for one hour.

After the reaction is completed and the reaction flask is cooled to the room temperature, 400 grams of the methanol is added for a product to precipitate. After the product is collected and washed three times with the methanol, the fluorine-containing maleimide compound (hereinafter referred to as MA-5) can be obtained. In Synthesis Example 5, the amount of the fluorine atoms in the fluorine-containing maleimide compound is 45.3 wt %.

It should be noted that the above-mentioned fluorine-containing maleimide compounds can be directly used as the maleimide resin, but can also be mixed with other fluorine-free maleimide compounds for being used as the maleimide resin.

Figure 2:
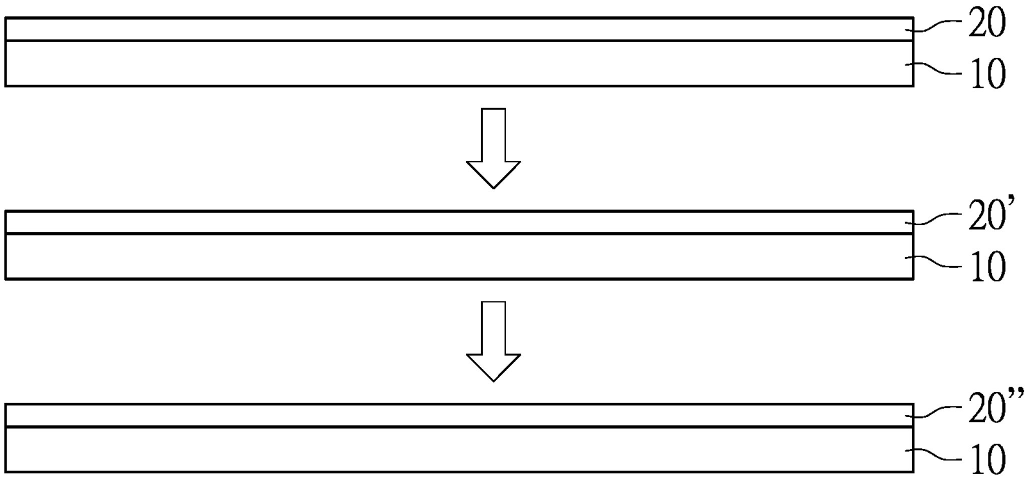
FIG. 2 is a schematic view showing manufacturing of a cured product according to the present disclosure.

Reference is made to FIG. 2, which shows how the cured product is manufactured. Firstly, the resin composition that includes the above-mentioned maleimide resin is prepared and coated onto a metal substrate 10, so as to form a resin film 20. Then, at a temperature from 70° C. to 200° C., the resin film 20 is cured to form a semi-cured film 20'. The semi-cured film 20' is hot pressed, so that a cured product 20" can be obtained.

Figure 3:
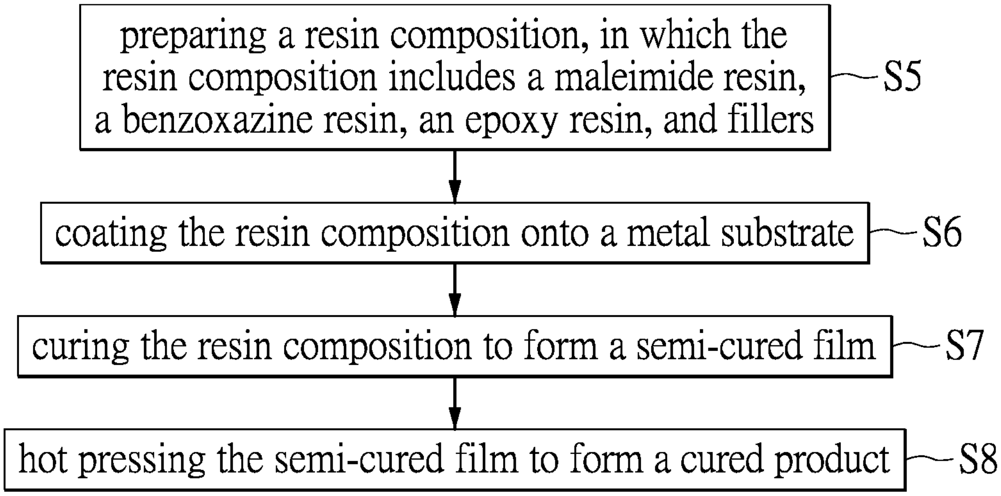
FIG. 3 is a flowchart illustrating steps of a manufacturing method of the cured product according to the present disclosure.

As shown in FIG. 3, specific steps of manufacturing the cured product include: preparing the resin composition, in which the resin composition includes the maleimide resin, the benzoxazine resin, the epoxy resin, and the fillers (step S5); coating the resin composition onto a metal substrate (step S6); curing the resin composition at the temperature from 70° C. to 200° C. to form a semi-cured film (step S7); and hot pressing the semi-cured film to form the cured product (step S8).

Figure 4:
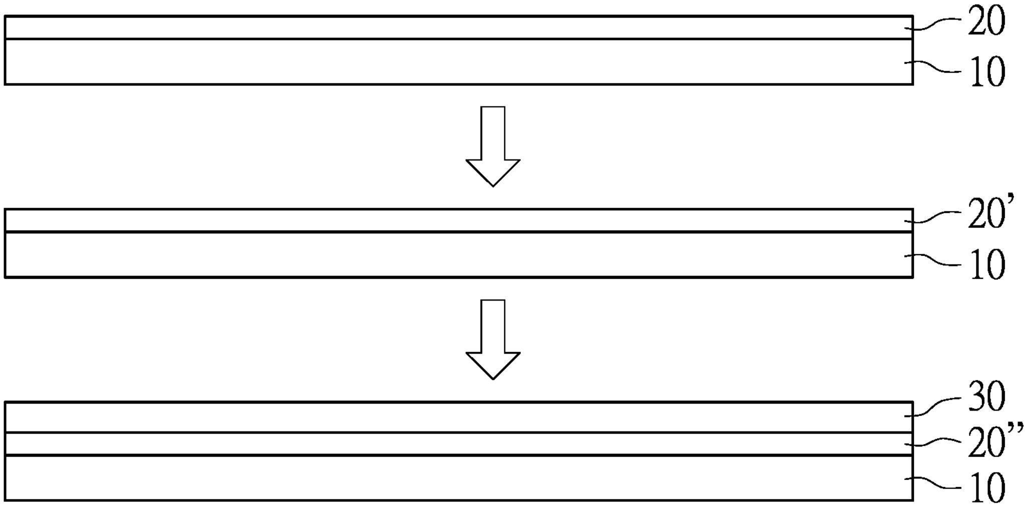
FIG. 4 is a schematic view showing manufacturing of a metal clad substrate according to the present disclosure.

Reference is made to FIG. 4, which shows how the metal clad substrate is manufactured. Firstly, the resin composition that includes the above-mentioned maleimide resin is prepared and coated onto the metal substrate 10, so as to form the resin film 20. Then, at the temperature from 70° C. to 200° C., the resin film 20 is cured to form the semi-cured film 20'. A printed circuit board 30 is disposed on the semi-cured film 20' for hot pressing, so that the semi-cured film 20' is formed into the cured product 20" and the metal clad substrate is obtained.

Figure 5:
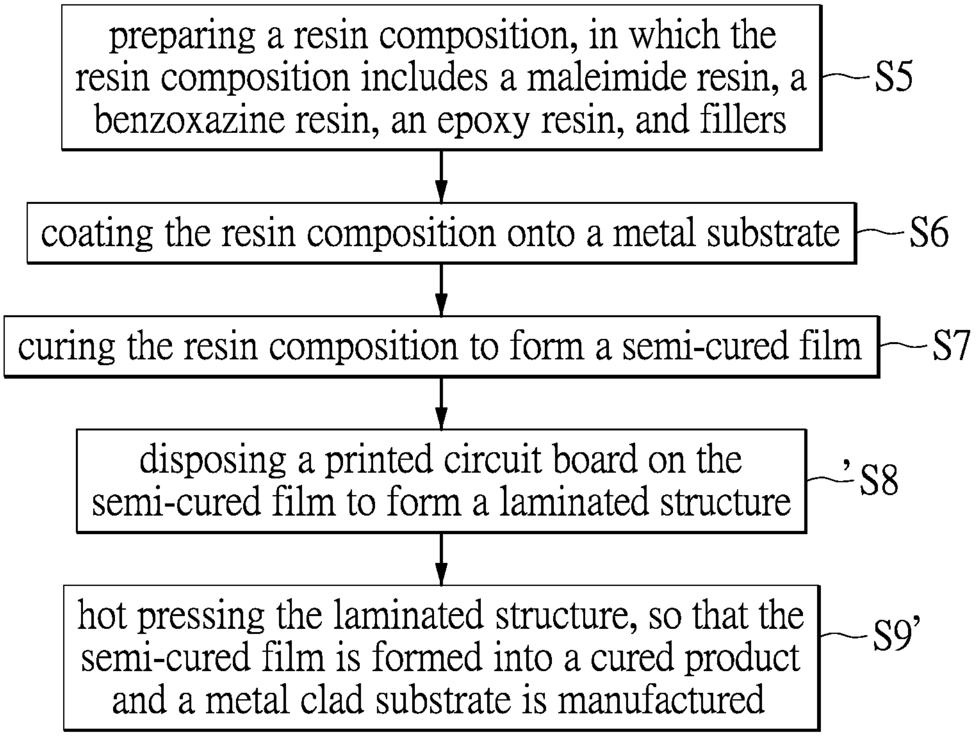
FIG. 5 is a flowchart illustrating steps of a manufacturing method of the metal clad substrate according to the present disclosure.

Reference is made to FIG. 5, in which specific steps of manufacturing the metal clad substrate are illustrated. Step S5 to Step S7 in the steps of manufacturing the metal clad substrate are the same as those in the steps of manufacturing the cured product, which will not be reiterated herein. After the semi-cured film is formed (step S7), a printed circuit board is disposed on the semi-cured film to form a laminated structure (step S8'). The laminated structure is hot pressed, so that the semi-cured film is formed into the cured product and the metal clad substrate is manufactured (step S9').

In the above-mentioned manufacturing methods of the cured product and the metal clad substrate, the resin composition is formed into the cured product after the steps of curing and hot pressing. It should be noted that, during the curing process of the resin composition, the fluorine-containing maleimide compound is reactively grafted with a molecular side chain of the benzoxazine resin, and the effect of modifying the benzoxazine resin can be achieved. Since the amount of the fluorine atoms in the maleimide resin is controlled in the present disclosure, a dielectric constant and hygroscopicity of the benzoxazine resin can be improved through an appropriate amount of the fluorine atoms.

In order to illustrate the properties and advantages of the cured product and the metal clad substrate of the present disclosure, metal clad substrates of Examples 1 to 9 (E1 to E9) and Comparative Examples 1 to 4 (C1 to C4) are manufactured according to the steps mentioned above.

Resin compositions of Examples 1 to 9 and Comparative Examples 1 to 4 include resins of different types and different amounts (specific components and amounts are shown in Table 1), so as to compare the effects of the different resin compositions with respect to the properties of the metal clad substrate. The difference between Examples 1 to 9 and Comparative Examples 1 to 4 resides in that a bismaleimide resin (i.e., the model BMI-70 produced by KI Chemical Industry Co., Ltd.) added in Comparative Examples 1 to 4 does not contain the fluorine atoms.

Examples 1 to 9

In Examples 1 to 9 (E1 to E9), based on the components and amounts listed in Table 1, the maleimide resin (i.e., at least one of MA-1, MA-2, MA-3, MA-4 and MA-5 with BMI-70 being selectively included) and the benzoxazine resin (i.e., a bisphenol A benzoxazine resin and a diamine-type benzoxazine resin) are added into 40 grams of the solvent (i.e., butanone) and completely dissolved. Then, the epoxy resin (i.e., a cresol novolac epoxy resin, a bisphenol A novolac epoxy resin, a bisphenol A epoxy resin, and a long-chain epoxy resin), a toughening agent (i.e., liquid polybutadiene), and a flame retardant are added, evenly mixed by a homogeneous mixer, and dissolved. The fillers (i.e., silicon dioxide) are added after a complete dissolution, and are continuously stirred and dispersed by the homogeneous mixer, so as to complete preparation of the resin composition.

After being coated onto the metal substrate (i.e., a copper foil) by use of a scraper, the resin composition is baked for three minutes at 80° C., and is baked for another seven minutes at 180° C. After drying, the semi-cured film can be obtained. Then, the printed circuit board is disposed on the semi-cured film to form the laminated structure. After the laminated structure is hot pressed, the metal clad substrate can be obtained.

Comparative Examples 1 to 4

In Comparative Examples 1 to 4 (C1 to C4), based on the components and amounts listed in Table 1, the bismaleimide resin (i.e., BMI-70) and the benzoxazine resin (i.e., the bisphenol A benzoxazine resin and the diamine-type benzoxazine resin) are added into 40 grams of the solvent (i.e., the butanone) and completely dissolved. Then, the epoxy resin (i.e., the cresol novolac epoxy resin, the bisphenol A novolac epoxy resin, the bisphenol A epoxy resin, and the long-chain epoxy resin), the toughening agent (i.e., the liquid polybutadiene), and the flame retardant are added, evenly mixed by the homogeneous mixer, and dissolved. The fillers (i.e., the silicon dioxide) are added after a complete dissolution, and are continuously stirred and dispersed by the homogeneous mixer, so as to complete preparation of the resin composition.

After being coated onto the metal substrate (i.e., the copper foil) by use of the scraper, the resin composition is baked for three minutes at 80° C., and is baked for another seven minutes at 180° C. After drying, the semi-cured film can be obtained. Then, the printed circuit board is disposed on the semi-cured film to form the laminated structure. After the laminated structure is hot pressed, the metal clad substrate can be obtained.

[Property Tests]

Glass transition temperature (Tg): using a thermomechanical analyzer (TMA) to measure the glass transition temperature of the metal clad substrate.

Coefficient of thermal expansion (CTE): measuring, according to the IPC-TM-650 2.4.24.5 standard, a z-axis coefficient of thermal expansion (z-CTE) of the metal clad substrate within a temperature range of from 50° C. to 260° C. by use of the thermomechanical analyzer.

Peeling strength: drying the metal clad substrate, and then measuring an external force required for vertically stripping off the copper foil (i.e., the metal substrate) having a width of ⅛ inches, so as to perform quantization of the peeling strength of the metal clad substrate.

Heat resistance: drying the metal clad substrate, immersing the metal clad substrate into a solder bath at 300° C. for 100 seconds, and repeating the immersion three times. The symbol "○" is used for indicating that the appearance of the metal clad substrate remains the same, and the symbol "x" is used for indicating bubbling or blistering of the metal clad substrate.

Water absorption rate: (1) cutting the metal clad substrate into a sample having a side length of 10 cm and a thickness of 25 lam, baking the sample in an oven at 120° C. for one hour, taking out the sample, and weighing the same to obtain W1; and (2) immersing the sample into water at 25° C. for 24 hours, taking out the sample and wiping the water on the surface of the sample, and weighing the same to obtain W2. A formula for calculating the water absorption rate is: $(W2-W1)/W1\times100\%$.

Dielectric properties: cutting the metal clad substrate into a sample having a side length of 6 cm and a thickness of 25 lam, baking the sample in the oven at 120° C. for one hour, and placing the same in an optical cavity, so as to measure the dielectric constant and the dielectric loss.

TABLE 1

| (phr) | | E1 | E2 | E3 | E4 | E5 | E6 | E7 | E8 | E9 |
|---|---|---|---|---|---|---|---|---|---|---|
| Epoxy resin | Cresol novolac epoxy resin | 10 | 10 | 10 | 10 | 10 | 10 | 10 | 10 | 10 |
| | Bisphenol A novolac epoxy resin | 15 | 15 | 15 | 15 | 12.5 | 12.5 | 12.5 | 15 | 15 |
| | Bisphenol A epoxy resin | 15 | 15 | 15 | 15 | 15 | 15 | 15 | 15 | 15 |
| | Long-chain epoxy resin | 25 | 25 | 25 | 25 | 25 | 25 | 25 | 25 | 25 |
| Benzoxazine resin | Bisphenol A benzoxazine resin | 10 | 10 | 10 | 10 | 10 | 10 | 10 | 10 | 10 |
| | Diamine-type benzoxazine resin | 5 | 5 | 5 | 5 | 5 | 5 | 5 | 5 | 5 |
| Maleimide resin | BMI-70 | — | — | — | 2.5 | 5 | 2.5 | 5 | — | — |
| | MA-1 | 10 | — | — | 7.5 | 5 | — | — | — | — |
| | MA-2 | — | 10 | — | — | — | 7.5 | 5 | — | — |
| | MA-3 | — | — | 10 | — | — | — | — | — | — |
| | MA-4 | — | — | — | — | — | — | — | 10 | — |
| | MA-5 | — | — | — | — | — | — | — | — | 10 |
| | Amount of fluorine atoms (wt %) | 32.0 | 27.2 | 16.6 | 24.0 | 16.0 | 20.4 | 13.6 | 25.1 | 45.3 |
| Fillers | | 60 | 60 | 60 | 60 | 60 | 60 | 60 | 60 | 60 |
| Toughening agent | | 5 | 5 | 5 | 5 | 5 | 5 | 5 | 5 | 5 |
| Flame retardant | | 5 | 5 | 5 | 5 | 5 | 5 | 5 | 5 | 5 |
| Property tests | | | | | | | | | | |
| Tg (° C.) | | 171 | 170 | 168 | 167 | 165 | 168 | 168 | 173 | 178 |
| z-CTE (%) | | 1.2% | 1.3% | 1.5% | 1.4% | 1.5% | 1.5% | 1.5% | 1.3% | 1.1% |
| Peeling strength (lbf/in) | | 5.7 | 5.4 | 5.9 | 5.3 | 5.2 | 5.2 | 5.4 | 5.4 | 5.2 |
| Heat resistance | | ○ | ○ | ○ | ○ | ○ | ○ | ○ | ○ | ○ |
| Water absorption rate | | 0.25% | 0.27% | 0.31% | 0.32% | 0.35% | 0.3% | 0.3% | 0.23% | 0.3% |
| Dielectric constant (10 GHz) | | 3.92 | 3.98 | 3.94 | 3.96 | 3.94 | 3.98 | 3.97 | 3.91 | 3.81 |
| Dielectric loss (10 GHz) | | 0.0080 | 0.0082 | 0.0085 | 0.0084 | 0.0083 | 0.0085 | 0.0086 | 0.0076 | 0.0070 |

| (phr) | | C1 | C2 | C3 | C4 |
|---|---|---|---|---|---|
| Epoxy resin | Cresol novolac epoxy resin | 10 | 10 | 10 | 10 |
| | Bisphenol A novolac epoxy resin | 10 | 12.5 | 12.5 | 12.5 |
| | Bisphenol A epoxy resin | 12.5 | 15 | 15 | 15 |
| | Long-chain epoxy resin | 25 | 25 | 25 | 25 |
| Benzoxazine resin | Bisphenol A benzoxazine resin | 10 | 10 | 10 | 10 |
| | Diamine-type benzoxazine resin | 5 | 5 | 5 | 5 |
| Maleimide resin | BMI-70 | 15 | 10 | 7.5 | 5 |
| | MA-1 | — | — | — | — |
| | MA-2 | — | — | — | — |
| | MA-3 | — | — | — | — |
| | MA-4 | — | — | — | — |
| | MA-5 | — | — | — | — |
| | Amount of fluorine atoms (wt %) | 0 | 0 | 0 | 0 |
| Fillers | | 60 | 60 | 60 | 60 |
| Toughening agent | | 5 | 5 | 5 | 5 |
| Flame retardant | | 5 | 5 | 5 | 5 |
| Property tests | | | | | |
| Tg (° C.) | | 166 | 156 | 156 | 152 |
| z-CTE (%) | | 2.2% | 2.0% | 1.8% | 1.7% |
| Peeling strength (lbf/in) | | 5.2 | 5.2 | 5.3 | 5.6 |
| Heat resistance | | ○ | ○ | ○ | ○ |
| Water absorption rate | | 0.42% | 0.46% | 0.52% | 0.55% |
| Dielectric constant (10 GHz) | | 4.17 | 4.19 | 4.18 | 4.20 |
| Dielectric loss (10 GHz) | | 0.0105 | 0.0110 | 0.0115 | 0.0125 |

As shown from results in Table 1, compared with Comparative Examples 1 to 4, the metal clad substrates of Examples 1 to 9 have a lower coefficient of thermal expansion, a lower water absorption rate, a lower dielectric constant, and a lower dielectric loss. Accordingly, by using the maleimide resin that contains the fluorine atoms in the present disclosure, the properties of the metal clad substrate can be enhanced.

To be specific, since the glass transition temperature of the metal clad substrate ranges from 165° C. to 180° C., and the z-axis coefficient of thermal expansion of the metal clad substrate is between 1.0% and 1.5%, the metal clad substrate has excellent heat resistance.

The peeling strength of the metal clad substrate is between 5.2 lbf/in and 6.0 lbf/in, which meets the use requirements. The water absorption rate of the metal clad substrate is between 0.20% and 0.35%, thereby preventing too much water vapor from adhering to the metal clad substrate.

In terms of the dielectric properties, the dielectric constant of the metal clad substrate is between 3.8 and 4.0, and the dielectric loss of the metal clad substrate is between 0.0075 and 0.0090.

As shown from the results in Table 1, the epoxy resin of the present disclosure can include the cresol novolac epoxy (CNE) resin, the bisphenol A novolac epoxy (BNE) resin, the bisphenol A epoxy resin, and the long-chain epoxy resin. Based on a total weight of the epoxy resin being 100 wt %, an amount of the cresol novolac epoxy resin ranges from 12 wt % to 20 wt %, an amount of the bisphenol A novolac epoxy resin ranges from 18 wt % to 25 wt %, an amount of the bisphenol A epoxy resin ranges from 20 wt % to 25 wt %, and an amount of the long-chain epoxy resin ranges from 35 wt % to 45 wt %.

As shown from the results in Table 1, the benzoxazine resin of the present disclosure can include the bisphenol A benzoxazine resin and the diamine-type benzoxazine resin. In one exemplary embodiment, an amount of the bisphenol A benzoxazine resin is greater than an amount of the diamine-type benzoxazine resin. Preferably, the amount of the bisphenol A benzoxazine resin is 1.5 to 2.5 times the amount of the diamine-type benzoxazine resin.

As shown from the results in Table 1, in the resin composition of the present disclosure, an amount of the benzoxazine resin is 1.3 to 1.8 times an amount of the maleimide resin. Preferably, the amount of the benzoxazine resin is 1.4 to 1.6 times the amount of the maleimide resin. In this way, an improved modification effect can be achieved, and the dielectric constant and the hygroscopicity of the benzoxazine resin can be reduced.

As shown from the results in Table 1 (comparisons can be made for Examples 1, 2, 3, 8 and 9), when the structure of the fluorine-containing maleimide compound (i.e., the fluorine-containing aniline) in the maleimide resin is symmetrical, the metal clad substrate can have a lower dielectric constant and a lower dielectric loss.

Beneficial Effects of the Embodiments

In conclusion, in the resin composition and the metal clad substrate provided by the present disclosure, by virtue of "the resin composition including: 5 phr to 15 phr of a maleimide resin, 5 phr to 30 phr of a benzoxazine resin, 40 phr to 70 phr of an epoxy resin, and 40 phr to 60 phr of fillers" and "an amount of fluorine atoms contained in the maleimide resin ranging from 10 wt % to 50 wt %," the coefficient of thermal expansion, the water absorption rate, the dielectric constant, and the dielectric loss of the metal clad substrate can be reduced.

More specifically, by virtue of "the fluorine-containing maleimide compound being reactively grafted with a molecular side chain of the benzoxazine resin," the cured product and the metal clad substrate can have a low coefficient of thermal expansion, a low water absorption rate, a low dielectric constant, and a low dielectric loss.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A resin composition, comprising:

5 to 15 parts by weight of a maleimide resin, wherein an amount of fluorine atoms contained in the maleimide resin ranges from 10 wt % to 50 wt %;

5 to 30 parts by weight of a benzoxazine resin;

40 to 70 parts by weight of an epoxy resin; and 40 to 60 parts by weight of fillers, wherein the epoxy resin includes a cresol novolac epoxy resin, a bisphenol A novolac epoxy resin, a bisphenol A epoxy resin, and a long-chain epoxy resin, and wherein based on a total weight of the epoxy resin being 100 wt %, an amount of the cresol novolac epoxy resin ranges from 12 wt % to 20 wt %, an amount of the bisphenol A novolac epoxy resin ranges from 18 wt % to 25 wt %, an amount of the bisphenol A epoxy resin ranges from 20 wt % to 25 wt %, and an amount of the long-chain epoxy resin ranges from 35 wt % to 45 wt %.

2. The resin composition according to claim 1, wherein the maleimide resin includes a fluorine-containing maleimide compound, and the fluorine-containing maleimide compound is represented by formula (I):

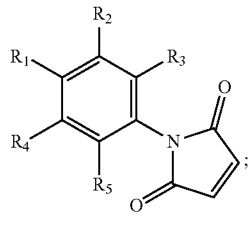

;

wherein $R_1$ is selected from the group consisting of —F and —$CF_3$;

wherein at least one of $R_2$, $R_3$, $R_4$, and $R_5$ is —F or —$CF_3$.

3. The resin composition according to claim 2, wherein the fluorine-containing maleimide compound is formed by an imidization reaction between maleic anhydride and fluorine-containing aniline; wherein the fluorine-containing aniline is represented by formula (II):

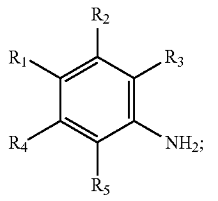

wherein $R_1$ is selected from the group consisting of —F and —$CF_3$;

wherein at least one of $R_2$, $R_3$, $R_4$, and $R_5$ is —F or —$CF_3$.

4. The resin composition according to claim 3, wherein the fluorine-containing aniline is selected from the group consisting of:

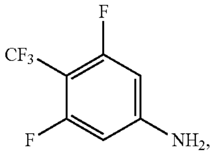

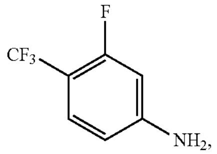

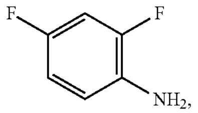

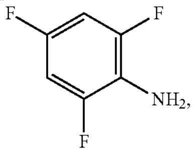

and

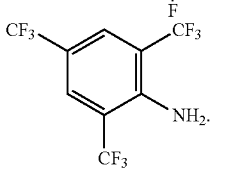

5. The resin composition according to claim 1, wherein the benzoxazine resin further includes a bisphenol A benzoxazine resin and a diamine-containing benzoxazine resin.

6. The resin composition according to claim 5, wherein an amount of the bisphenol A benzoxazine resin is greater than an amount of the diamine-containing benzoxazine resin.

7. The resin composition according to claim 1, wherein an amount of the benzoxazine resin is 1.3 to 1.8 times an amount of the maleimide resin.

8. A metal clad substrate, comprising:

a metal substrate;

a cured product formed on the metal substrate, wherein the cured product is formed after curing of a resin composition; wherein the resin composition includes: 5 to 15 parts by weight of a maleimide resin, 5 to 30 parts by weight of a benzoxazine resin, 40 to 70 parts by weight of an epoxy resin, and 40 to 60 parts by weight of fillers; wherein an amount of fluorine atoms contained in the maleimide resin ranges from 10 wt % to 50 wt %; and a printed circuit board formed on the cured product, wherein the epoxy resin includes a cresol novolac epoxy resin, a bisphenol A novolac epoxy resin, a bisphenol A epoxy resin, and a long-chain epoxy resin, and wherein based on a total weight of the epoxy resin being 100 wt %, an amount of the cresol novolac epoxy resin ranges from 12 wt % to 20 wt %, an amount of the bisphenol A novolac epoxy resin ranges from 18 wt % to 25 wt %, an amount of the bisphenol A epoxy resin ranges from 20 wt % to 25 wt %, and an amount of the long-chain epoxy resin ranges from 35 wt % to 45 wt %.

9. The metal clad substrate according to claim 8, wherein the maleimide resin includes a fluorine-containing maleimide compound, and the fluorine-containing maleimide compound is represented by formula (I):

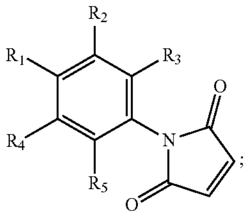

wherein $R_1$ is selected from the group consisting of —F and —$CF_3$;

wherein at least one of $R_2$, $R_3$, $R_4$, and $R_5$ is —F or —$CF_3$.

10. The metal clad substrate according to claim 9, wherein the fluorine-containing maleimide compound is reactively grafted with a molecular side chain of the benzoxazine resin.

* * * * *